United States Patent [19]

McVey et al.

[11] 4,357,646
[45] Nov. 2, 1982

[54] CAPACITIVE KEYSWITCH WITH OVERTRAVEL MECHANISM ON MOVEABLE PLATE

[75] Inventors: John K. McVey, Bensenville; Stanley E. Filipiak, Chicago, both of Ill.

[73] Assignee: Illinois Tool Works Inc., Chicago, Ill.

[21] Appl. No.: 226,654

[22] Filed: Jan. 21, 1981

[51] Int. Cl.³ .............................................. H01G 5/16
[52] U.S. Cl. .............................. 361/288; 200/DIG. 1; 361/278; 261/290
[58] Field of Search ....................... 361/288, 290, 278; 200/DIG. 1

[56] References Cited

U.S. PATENT DOCUMENTS 1,729,704 10/1929 Brokaw ................................ 361/290
3,808,556 4/1974 Dome ............................... 361/290 X
4,090,229 5/1978 Cencel et al. .

*Primary Examiner*—Elliot A. Goldberg

*Attorney, Agent, or Firm*—Donald D. Mondul; Thomas W. Buckman

[57] ABSTRACT

A capacitive keyswitch is formed with a fixed horizontal plate that is imbedded in a horizontal printed circuit board below an overlaying dielectric layer and a moveable cantilever mounted plate that is hinged to the printed circuit board so as to project upwardly at an acute angle. When a plunger is actuated, a portion of it presses down on an overtravel mechanism that is formed from the moveable plate which causes the moveable plate to assume approximately a parallel position with respect to fixed horizontal plate, thereby changing the capacitance of the switch and actuating the switch. The overtravel mechanism consists of a tab cut out of a bent-up portion of the moveable plate so that the tab is bent along an intersection line formed by the intersection of the plane or moveable plate and the plane of the bent-up section.

4 Claims, 3 Drawing Figures

U.S. Patent  Nov. 2, 1982  4,357,646
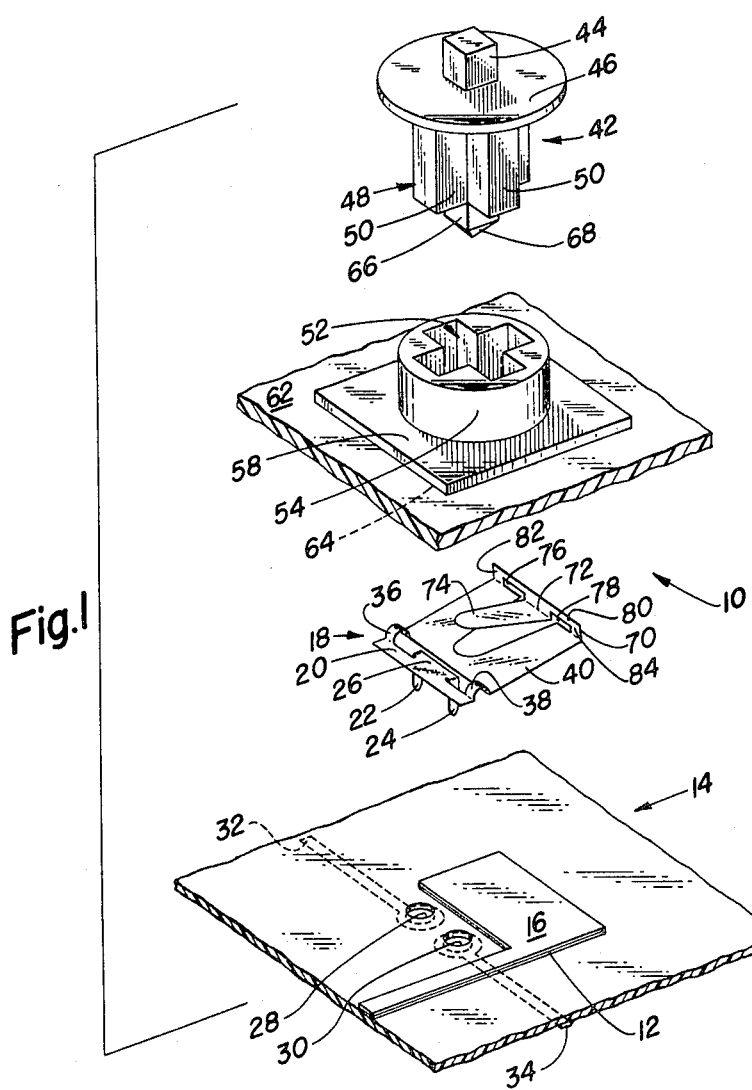
Fig.1
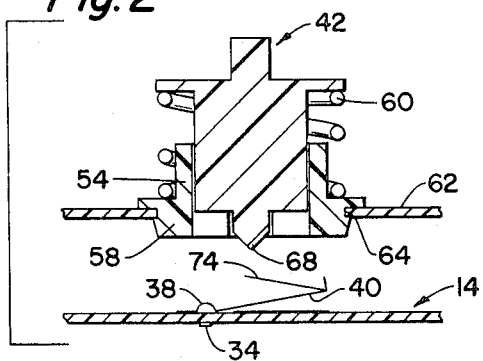
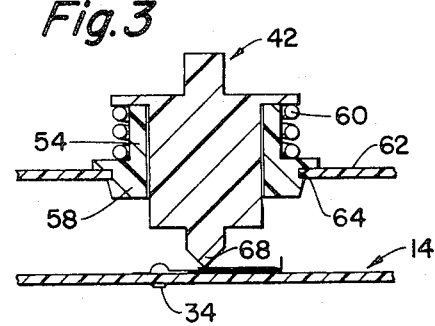

CAPACITIVE KEYSWITCH WITH OVERTRAVEL MECHANISM ON MOVEABLE PLATE

BACKGROUND OF THE INVENTION

Electrical keyboards for manual input to data processing system have increasingly adopted capacitive circuitry in recent years since capacitive keyswitches, when properly designed, may provide reliable operation at low cost. In electrical keyboards, however, it is extremely desirable to provide an overtravel mechanism, which means that the key plunger may be depressed beyond the minimum amount which is needed to activate the data processing equipment.

A number of advantages are obtained from such an overtravel mechanism. First, the use of overtravel requires that the plunger will be depressed beyond the minimum amount that is required to insure position of the switching action. Next, the use of overtravel tends to result in a reduction of the bounce that otherwise might occur since the overtravel mechanism acts as a shock absorber when the plunger is depressed. Furthermore, with overtravel, the plunger will be depressed at least a minimum period which helps to discriminate against noise or teasing of the switch.

A simple overtravel mechanism which is formed by a tab cut out of an electrical contact arm that is mounted at an acute angle in a switch is found in the Golbeck et al. U.S. Pat. No. 3,916,131, issued Oct. 28, 1975. This same type of inexpensive overtravel mechanism is found in a capacitive switch in the Cencel U.S. Pat. No. 4,090,229 wherein it is combined with a pair of elongated leaf spring hinges which are formed by slots in the metal moveable capacitor plate.

The cut-out tab overtravel mechanism of the Golbeck et al. and Cencel et al. patents is a cost-effective means of obtaining overtravel in a capacitive switch. However, since the tab is separated from the remainder of the capacitor plate in the Cencel device, an irregular variation in the capacitance of the keyswitch can occur as the tab is flexed. In addition, in the Cencel et al. patent, the elongated springs that are formed by slots in the capacitive plate can cause another undesired variation in the capacitance as the plate is depressed. In a capacitive keyswitch, it is desirable, of course, to minimize any variations that can occur due to slots or openings in the moveable capacitive plate itself. In addition, it has been found that if the moveable capacitive plates are constructed as shown in the Cencel et al. patent, they tend to bow upon full depression due to the particular hinging arrangement that is employed, thereby causing further unwanted variations of the capacitance between the plates of the keyswitch.

The present invention is directed to an overtravel mechanism which allows the moveable capacitive plate to be fully depressed with virtually no bowing and which, in addition, eliminates the need for cutting the overtravel tab out of the moveable plate.

DESCRIPTION OF THE DRAWINGS

The present invention is described by reference to the drawings in which:

FIG. 1 is a perspective-exploded view of the fixed and moveable plates and the plunger of a capacitive keyswitch made in accordance with the present invention;

FIG. 2 is a side cross-sectional view of the switch in the unactuated position;

FIG. 3 is a side cross-sectional view of the switch in the actuated position with the plunger depressed.

TECHNICAL DESCRIPTION OF THE INVENTION

As shown in FIG. 2, the capacitive keyswitch 10 of the present invention is constructed with a fixed, horizontal conductive capacitor plate 12 that is imbedded in a printed circuit board 14 and is covered by a dielectric thin film layer 16. The moveable plate 18 of the capacitive switch is formed with a flat elongated support member 20 which carries a pair of tabs 22, 24 that extend downwardly from the bracket 26. The tabs 22, 24 project downwardly through the apertures 28, 30 in the printed circuit board 14 and are inserted into the apertures 28, 30 so they may be soldered therein to make electrical connection to the conductive paths 32, 34 that are imbedded in the board 14. The moveable plate 18 is hinged about the hinges 36, 38 which may be loop hinges of the adjustable capacitor type that were employed in early radio circuits such as those shown in the Brokaw U.S. Pat. No. 1,729,704. Alternately, straight, flat hinges could be used.

The moveable plate 40 of the keyswitch of the present invention has an active portion which lies in a first plane that makes an acute angle with the plane of the fixed plate 12. A small fraction of the total surface area of the moveable plate 40 is bent up at the end of the plate 40 to form the upward projection 70. The plane of the projection 70 and the plane of the main portion 40 of the plate, therefore, intersect along the dotted intersection line labelled 72. The overtravel mechanism for the keyswitch 10 is formed by the tab 74 which is separated from the plate 40 and which is also separated from the bent-up section 70 by virtue of the apertures 76, 78. The tab joins the elongated upper portion 80 of the bent-up section 70 and extends downwardly a portion of its length parallel to the edges 82, 84 until it reaches the intersection line 72 at which point tab 74 is bent so that it projects upwardly in a third plane at an acute angle with respect to the plane of the moveable plate 40.

The actuating mechanism 42 for the keyswitch is formed with a plunger 48 that has an upwardly projecting key receiving post 44 and a spring support ring 46. Below the ring 46 there are four ribs 50 which are arranged at right angles to form a cross pattern. The ribs 50 project into a corresponding cross-shaped aperture 52 that is formed in the guide boss 54 which projects from the base 58. A supporting board 62 fits into the slotted groove 64 in the base 58 to support the actuating mechanism above the moveable capacitor plate. Below the ribs 50 there is a downwardly projecting pin 66 which has a contact point 68 formed on its lower end which contacts the overtravel tab 74 when the keyswitch is actuated.

As shown in FIGS. 2 and 3, a return spring 60 is positioned between the ring 46 and the upper surface of the platform 58. When the plunger 48 of the keyswitch is depressed, and the switch is actuated, the moveable plate 40 moves to a position that is approximately parallel to the horizontal plate 12, where there is essentially no bowing of the moveable plate due to the fact that the base of the tab is joined to the bent-up section 70 so that a portion of the tab lies in the plane of the section 70 and the remainder of the tab projects at an acute angle with respect to the plane of the active portion of the moveable plate 40 since the tab is bent along the intersection line 72. The angle between the section 70 and the active portion of the plate 40 is preferably 90° as shown in FIGS. 2 and 3.

What is claimed is:

1. A capacitive keyswitch comprising a fixed flat capacitive plate in a first plane, a flat, moveable capacitor plate hinged at one end to project in a second plane and to move toward a parallel position with respect to said fixed plate when an actuating force is applied to said moveable plate, an actuating plunger for applying said force to said moveable plate, return means for returning the plunger to its unactuated position, a bent-up section at the free end of said moveable plate which projects in a third plane, and an overtravel tab that is separated from the portion of said moveable plate that lies in said second plane and from said bent-up section everywhere except for a segment that joins said bent-up section at the free-end of said moveable plate, said tab being bent to project in a fourth plane, said bent-up section thereby providing torsion hinging action for said overtravel tab and acting to minimize deformation of said moveable plate when said actuating plunger applies an actuating force thereto.

2. The keyswitch of claim 1 wherein said second and fourth planes form an angle of approximately 90°.

3. The keyswitch of claim 1 wherein said tab is bent along the intersection line formed by said second and fourth planes.

4. The keyswitch of claim 3 wherein said second and fourth planes form an angle of approximately 90°.

* * * * *